May 23, 1950 P. KUSCH 2,508,576

TUNABLE MAGNETRON

Filed Nov. 9, 1945

INVENTOR.
POLYKARP KUSCH

BY William D. Hall
Attorney.

Patented May 23, 1950 2,508,576

UNITED STATES PATENT OFFICE 2,508,576

TUNABLE MAGNETRON

Polykarp Kusch, New York, N. Y., assignor to the United States of America as represented by the Secretary of War Application November 9, 1945, Serial No. 627,723

7 Claims. (Cl. 250—27.5)

The invention described herein may be manufactured and used by or for the Government for governmental purposes, without the payment to me of any royalty thereon.

This invention relates to ultra high frequency generators of magnetron type in which ultra high frequency oscillations are generated in a plurality of resonators by high velocity electrons moving along curvilinear orbital paths, these paths being followed by the electrons because of the joint action of the electrostatic and electromagnetic fields.

It is an object of this invention to provide a frequency adjusting means for a magnetron having a substantially straight line relationship between the operating frequency and the position of the frequency adjusting means.

An additional object of this invention is to provide a tunable magnetron whose power output, efficiency, and pulling figure remain substantially constant over the tuning range of the magnetron.

Still another object of this invention is to provide a tuning magnetron capable of covering a reasonably large tuning range such as 17% of the basic operating frequency of the magnetron.

Still another object of this invention is to provide a tunable magnetron whose frequency may be determinable from a dial setting of the tuning means.

Numerous methods of tuning magnetrons have been advanced in the past and all of the known methods invariably suffer from such disadvantages as limited tuning range, non-linear variation of wave length or frequency with the movement of the tuning mechanicm, and what is even more important, the magnetron characteristics do not remain constant over the tuning range so that tuning is accompanied with large variations in efficiency or pulling figure over the available tuning range. Because of the non-linearity and non-predictability of the performance of the tuning mechanism, no tuning magnetrons were available in the prior art whose wave length could be determinable from dial settings of the tuning instrumentalities. One of the more effective means for tuning resonator magnetrons is disclosed in U. S. Patent No. 2,450,619, issued October 5, 1948, to the U. S. Government, where tuning is accomplished by inserting a plurality of metallic tuning pins into the resonating cavities of the anode. The pins move through small holes in a pole piece and the pin supporting mechanism is mounted in a well within the pole piece. The advantage of such tuning arrangements resides in the fact that by placing the tuning mechanism into the pole piece and allowing the tuning pins to protrude through the pole piece into the adjacent end space and into the anode of the magnetron, it is possible to make the end space between the pole piece and the anode as small as desired from the point of view of efficient operation of the magnetron. Stated differently, there is no necessity of increasing the height of the magnetic gap; therefore, the reluctance of the magnetic circuit in the tunable magnetron is equal to the reluctance in the non-tunable magnetrons. The tuning systems of this type produce very satisfactory results as long as the end space of the magnetron as well as the tuning pins have resonances in the regions sufficiently far removed from the resonances of the anode so as to avoid close coupling between the anode on one side and the end space and the tuning pins on the other. In the ultra high frequency region the physical dimensions of the above-mentioned elements are such that the tuning elements as well as the end space have resonances which are sufficiently close to the resonances of the anode and, unless some means are provided for separating the resonances of the anode from the resonances of the tuning elements, the efficiency of the magnetron may experience very marked depressions in the regions of close couplings; in extreme cases complete secession of oscillations or unexpected shift in the operating frequency and abnormal increase in the pulling figure may take place.

The invention avoids all these difficulties by introducing a resonance suppressing means into the end zone adjacent to the tuning instrumentalities, this means raising the resonant frequencies of the tuning pins to an extent which puts them into a resonance region which is completely removed and is beyond the operating resonant frequency of the anode.

These and other features of the invention will be more clearly understood from the following detailed description and the accompanying drawings in which.

Figure 1:
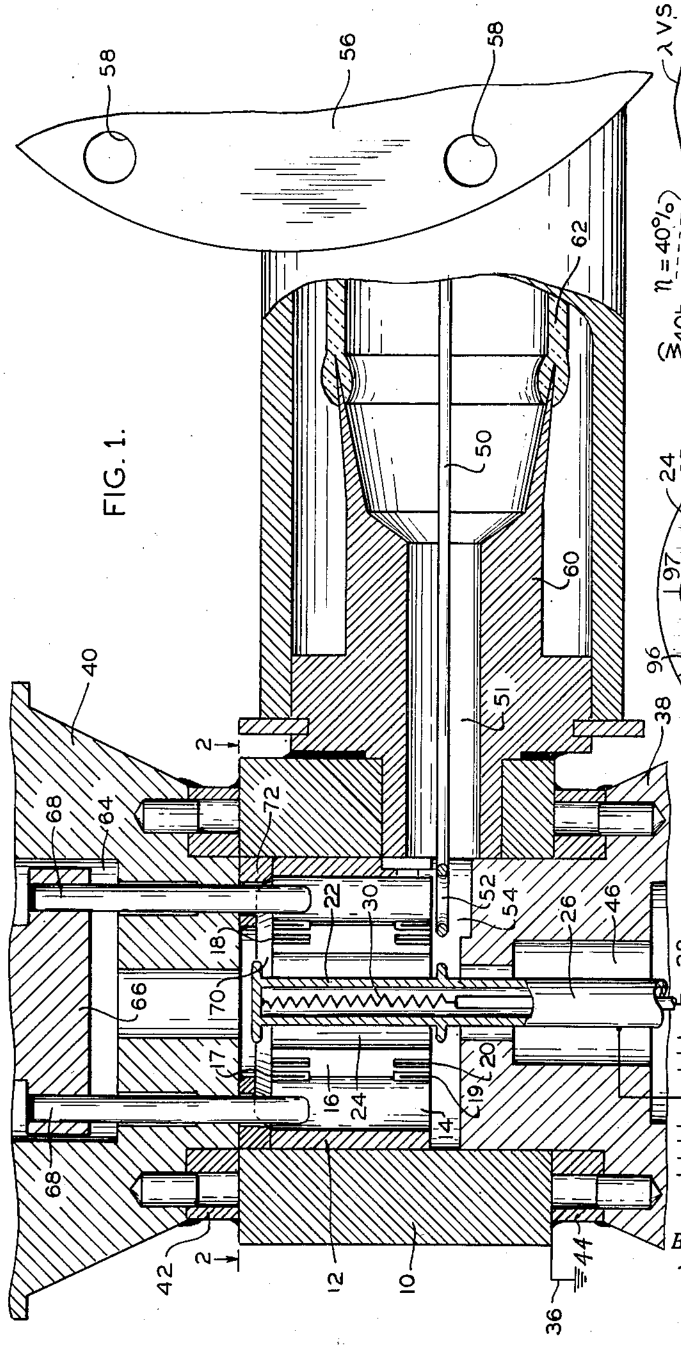
Figure 1 is an enlarged, vertical cross-sectional view of a magnetron including a cathode, an anode, and portions of the pole pieces and output circuit.
Figure 2:
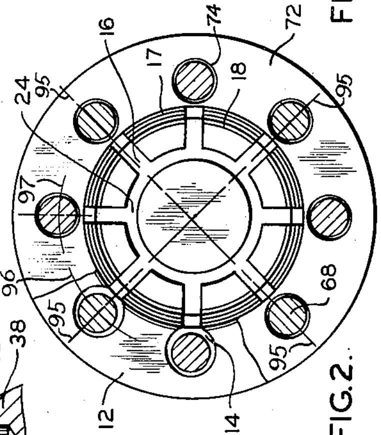
Figure 2 is a plan view of the resonance suppressing ring and of the anode taken along line 2—2 illustrated in Fig. 1.

Referring to Fig. 1, it illustrates, by the way of an example, a tunable, strapped, hole-and-slot, planetary type magnetron having eight resonating circuits, whose cross-section is illustrated more clearly in Fig. 2. As mentioned in brief description of Fig. 1, only the essential parts of the magnetron are illustrated in the figure, with a mounting plate, a cathode glass boot, cathode connections, permanent magnets, and mechanical instrumentalities for adjusting the position of the tuning pins being omitted from the drawing. For a more detailed description and construction of the omitted elements reference is made to the previously mentioned application of Simon Sonkin, Serial Number 623,424, which is hereby made part of this disclosure. An anode 12 made of copper is mounted in a non-magnetic copper shell 10, or a shell of any other metal, non-magnetic in character, and capable of serving as a vacuum envelope, the anode including resonating cavities 14, slots 16, and ring type straps 17, 18, 19 and 20. The ring type straps are used to separate the modes of oscillation of the resonators and to facilitate oscillations in the pi mode; the invention is applicable to strapped or unstrapped anodes, such as Rising Sun magnetron, in which no strapping of any kind is present. The cathode 22 is mounted coaxially in the interaction space 24 and is supported by a coaxial line including an outer Kovar tube 26 and an inner insulator conductor 28, which terminates in its upper portion in a cathode heating coil 30. The heater current is furnished by a source 32, and the anode potential is furnished by a grounded anode power supply 34. The circuit of the anode is closed through ground 36. The magnetic flux is furnished by two permanent magnets, not illustrated in the drawing which are connected to high permeability iron pole pieces, 38 and 40, only the inner portions of the pole pieces being illustrated in the figure. These are connected to the outer shell 10 through non-magnetic soldered rings 42 and 44 which make a gas-tight joint between the pole pieces and the shell. Rings 42 and 44 are inserted between the pole piece and shell 10 to facilitate the concentration of flux in the interaction space of the magnetron. Anode 12 is made of a block of copper shaped into a plurality of resonators whose boundaries are defined by the cylindrical cavities 14 and slots 16 as illustrated in Fig. 2.

The right portion of shell 10 is provided with an opening for connecting coaxial line 50 which terminates in a coupling loop 52 positioned in the lower end space 54 of the magnetron directly under one of the holes of the anode. The coaxial line and a coupling transformer 51 have relatively wide band characteristics and the coaxial line is coupled to a wave guide through a junction of wide band characteristic. This guide is connected to the line through a flange 56, only a portion of which is visible in the figure. The flange is connected to the wave guide by means of bolts which fit into holes 58 in the flange and corresponding holes in the wave guide. The coaxial line is soldered to shell 10 thus forming an air-tight joint between the non-magnetic copper stud 60 and the shell. Only a portion of a glass envelope 62 of the coaxial line is visible in the drawing.

The tuning mechanism of the magnetron is mounted in a well 64 of the tuning pole piece 40, the mechanism including a pin holder 66 usually made of iron or other magnetic material but which may be made of non-magnetic material without detriment to the operation of the device and a plurality of non-magnetic, metallic tuning pins 68. The pins protrude into the upper end space 70 of the magnetron and are radially aligned with the holes in the anode, as illustrated more clearly in Fig. 2. The upper end space 70 also includes a non-magnetic, metallic ring 72 which acts as the previously mentioned resonance suppressing means. Ring 72 is preferably made of copper or any other low resistance metal. It is provided with a plurality of openings 74, Fig. 2, so that the tuning pins may be inserted into the cavities of the anode through the openings in the ring as illustrated in Fig. 1. The ring is fastened either to the upper tuning pole piece 40 or shell 10 by a soldered joint.

Figure 3:
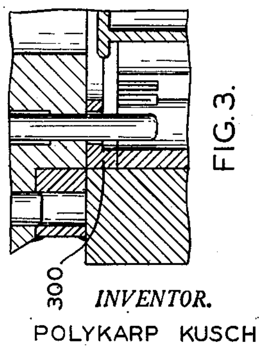
Figure 3 is an enlarged, vertical cross-sectional view of a detail illustrating a modified shape of the resonant suppressing ring, and, Figure 4 illustrates a series of typical performance curves obtainable with the tuning arrangement illustrated in Figs. 1, 2, and 3.

In Fig. 1 the lower portion of the resonance suppressing ring has an inner diameter approximately equal to the maximum diameter of the resonators, the ring approaching tangentially the outermost portions of holes 14. It then has a surface partially hanging over the cavities, this surface making a 45° angle with the adjacent circumferential surface of the anode. After embracing a portion of the pins, this surface is made horizontal and parallel to the surface of the anode. The inner diameter of the rectangular portion of the ring is somewhat less than the outer diameter of the slots. Ring 72 in Fig. 1 shortens the electrical length of the pins more than a rectangular ring 300 illustrated in Fig. 3. Actual experimental results with a 3.35–3.0 cm. magnetron indicated that ring 300 failed to shorten the electrical length of the pins sufficiently to avoid the anode-pin resonance coupling. When the electrical length of the pins was decreased still further, by introducing a 45° surface, Fig. 1, all dips in the wave length vs. power curve disappeared and the curve assumed the form illustrated in Fig. 4. It should be noted that the ring in either case is shaped so as to avoid blocking of space directly above and between the resonating cavities—the space or path followed by the electromagnetic fields linking the adjacent resonating cavities. The mechanism for adjusting the position of the tuning pins with respect to the anode is not illustrated in Fig. 1 since it does not represent a part of the present invention. For a complete disclosure of suitable mechanism for adjusting the position of the pins reference is made to the previous mentioned application of Simon Sonkin, Serial Number 623,424. Suffice it to say that it consists of metallic bellows connected with its lower end to the pole piece 40 and with its upper end to a flange of pin holder 66. The position of the pin holder 66 is adjusted by means of a rotating knob and a set screw, the latter lowering or raising the pin holder 66 in well 64 with the concomitant lowering or raising of the tuning pins.

The tuning of the magnetron is accomplished by turning the tuning knob which lowers or raises the tuning pins. The effect of the tuning pins on the resonators may be analyzed as follows: the fundamental method of varying the frequency of any resonating circuit is to change either the inductance or the capacity or both. Because the circuit constants in any planetary hole-and-slot magnetron are not lumped, it is of course impossible to vary strictly only the inductance or only the capacity of any single resonating circuit. However, it is possible to provide a tuning means which has a predominantly inductive over-all effect. In a magnetron oscillator of the strapped hole-and-slot type, it is difficult to introduce larger changes in resonator capacity essentially because large capacity changes would involve the use of very small clearances between the elements at high radio frequency potential. Moreover, by far the larger part of the capacitive changes in the conventional arrangements of this type would take place at the end portion of the mechanical movement, i. e., when the clearances between the tuning surfaces would be approaching zero values. Accordingly, it is a matter of technical difficulty approaching the impossible to achieve any linear relationship between the wave length and the movement of the tuning surfaces in any capacitive tuning of the magnetron. The inductance of the resonating circuits may, however, be altered simply by the insertion of any conductor into the inductive portion of the circuit, the conductor acting in effect as a short-circuiting means for some portion of the inductance present in the resonating circuit. Thus a large change in inductance may be introduced easily into a magnetron of the hole-and-slot type by the simple insertion of a cylindrical metallic pin into the cylindrical portion of the resonator with the pins being nearest to the inductive portions and farthest from the capacitative portions of the resonators. For this purpose, each pin 68 is positioned within the hole of each resonator along the radial axis 95, Fig. 2, thereof, but farther from the slot entrance and nearer to the opposite surface of the hole when strapping interferes with the coaxial positioning of the tuning pins in the holes. When strapping protrudes into the holes the pins may be eccentrically disposed within the holes as illustrated in Fig. 2 with the pitch circle 96 of the holes being smaller than the pitch circle 97 of the pins; stated differently, the locus 97 of the pin axes is a cylinder of greater radius than the locus 96 of the hole axes. Such positioning of the tuning pins removes them from the strapping elements 17 and 81 thus avoiding any possibility of accidental shorting of the resonating elements which may take place if the tuning pins happen to touch the strapping elements. This is an important factor in the ultra-high frequency magnetrons having small physical dimensions.

It is now possible to analyze the function performed by the resonance suppressing ring 72. Consider a magnetron with the geometry indicated in Figs. 1 and 2. In such geometry the pins themselves, together with the annular region between the pins and the anode shell, constitute an oscillatory circuit. In a general way the circuit capacity occurs between the walls and the pins of the cylindrical resonator and the inductance in the annular region. This system of pins will be characterized by a series of modes of oscillation each of a characteristic wave length. While the characteristic wave length of the anode decreases with increasing pin penetration, that of each of the modes of the pin system will increase with the increasing pin penetration. If for some pin penetration the characteristic wave lengths of the anode and of the pin's structure are coincident, and if there is any coupling between the two, large deviation from normal tube operation may be expected. First, the resonant pin system may pull the magnetron wave length over and above any alteration in wave length by the known resonant change in inductance; second, it may absorb a significant fraction of the electronically generated power; third, by the distortion of the radio frequency patterns in the magnetron, it may impair the electronic efficiency, and fourth, it may greatly alter the pulling figure. Moreover, there may be a presence of a very dominant auxiliary effect in which the pin system 68 apparently acts as a coupling device between the magnetron 12 and the coaxial line 26 supporting the cathode, which diverts a large quantity of the ultra high frequency power into the coaxial line of the cathode, the latter phenomenon in an extreme case completely blocking the normal operation of the magnetron.

In order that the tube may operate satisfactorily over the entire tuning range, it is therefore necessary that the spectrum of the pin structure be outside the range of the operating wave lengths of the magnetron. In general the free length of the pins which electrically engages the anode must be considerably less than $\lambda/4$ since the magnetron end space contributes a large amount of loading. It is this function, i. e., shorting of the electrical length of the tuning pins, that is performed by the resonance suppressing ring 72. Moreover, it reduces to as large an extent as possible the lumped inductance in the end space and effectively shortens the electrical lengths of the pins with the concomitant enhancing of the tuning properties of the pins and of the efficiency of the tube. Thus the resonance suppressing ring reduces to a minimum the undesirable degree of coupling between the anode resonators and the pins, the pin resonances being made by the resonance suppressing ring completely beyond the range of the tube resonances, and it also diminishes the loading of the anode by the end space.

Figure 4:
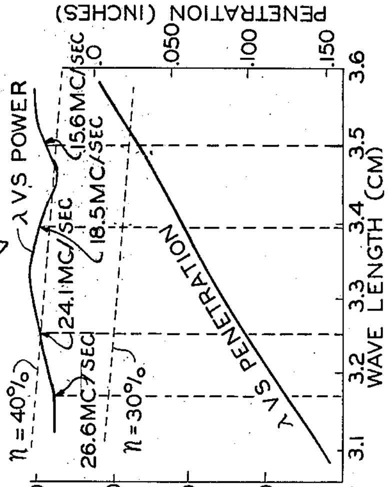

Fig. 4 illustrates the results of application of the tuning system disclosed in Figs. 1 and 2 to a magnetron having operating wave lengths from 3.1 to 3.6 centimeters. The bottom curve, which illustrates the operating wave length vs. the pin penetration in inches, is a substantially straight line which demonstrates the fact that the disclosed tuning systems are capable of producing a substantially linear frequency change with the adjustment of the tuning mechanism. Therefore the tuning knob used for lowering and raising pin holder 66 and pins 68 may be calibrated in terms of wave length generated by the magnetron, the resettability of the tuning system being limited only by the mechanical play or back-lash in the pin positioning adjusting mechanism. This may be controlled within 0.002 centimeter. The linear relationship between the wave length and the pin penetration is obtainable only when the resonances of the pins throughout their traveling range are completely beyond the resonances of the anode. When the resonance suppressing ring 72 is not present, the linear relationship illustrated in Fig. 4 disappears and the curve assumes an irregular, and sometimes unpredictable, shape. The second curve in Fig. 4 illustrates the wave length vs. power output in kilowatts. It is to be noted that only relatively small variations in the power output are present, and the pulling figure, which is indicated on the second curve at four operating wave lengths has equally small variations, varying from 26.6 mc./sec. at the lower end of the operating wave length. The observed effect is anomalous. If the pulling figure were constant throughout the operating wave lengths, efficiency would decrease at short wave length because of increased circuit losses. The increased pulling figure more than compensates for poorer efficiency. This constitutes indirect evidence that pin losses are not large. As in the case of the wave length curve, the efficiency curve has the indicated shape only when the resonance suppressing ring is used in the upper end space of the magnetron. With ring 72 removed from the end zone the magnetron ceases to operate altogether in the shorter wave length region. As is usual with magnetrons, the pulling figure may be reduced to lower values than that shown for the particular tube of Fig. 4 at the expense of efficiency by permitting a closer approach of the element 52 to the anode face. The performance characteristics illustrated in Fig. 4 are obtainable only when two criteria are met: (1) the output circuit consisting of a coupling loop, coaxial line, and the elements coupling the coaxial line to the magnetron, have broad band characteristics; (2) the effective unloaded Q of the resonator system is not altered appreciably throughout the tuning range. The broad band characteristic of the output circuit is discussed below.

In describing the output circuit of the magnetron it has been mentioned that all of the elements of the output circuit should have a sufficiently broad band characteristic to permit satisfactory operation over a required frequency range. This is an important factor and should be kept in mind in devising the tuning systems for the magnetrons as well as all details of the output circuit. The performance characteristics illustrated in Fig. 4 are obtainable only when the output circuit possesses a broad band characteristic. That is, it serves to couple the external line to the resonator elements to a constant extent over the entire frequency range generated by the magnetron. The disclosed tunable magnetron and the output circuit meet the requirements as to the output circuit as well as the effective unloaded Q of the resonator system. Numerous measurements of Q and $Q_0$ of the system indicated that there are no detrimental objectionable losses existing in the circuit when the wave length of the magnetron is altered between the limits indicated in Fig. 4.

While the invention has been specifically disclosed in connection with the hole-and-slot anode, it will be apparent to those skilled in the art that the invention is applicable to the anode structures of different types, such as vane type or Rising Sun type anodes, as disclosed in a copending application of Simon Sonkin, titled "Tunable magnetron," Serial No. 623,422, filed October 19, 1945, now abandoned. When the shape of the resonating cavity is other than a cylindrical hole, the shape of the tuning pins and of the ring may be modified so as to engage the inductive portion of the resonator with the pins in as effective a manner as the round pin engages the round hole; the ring is then modified to conform with the shape of the pins. It is to be noted however that any sharp discontinuities in the surfaces should be avoided in order to prevent excessive losses in the structure and accidental flash-overs.

While the invention has been described with reference to several particular embodiments, it will be understood that various modifications of the apparatus shown may be made within the scope of the following claims.

I claim:

1. A magnetron having an anode of a multiresonator-multicavity type, first and second pole pieces mounted in spaced relationship with respect to said anode, said pole pieces and said anode defining first and second end chambers respectively of said magnetron, a plurality of adjustable tuning members protruding from said first pole piece into said first end chamber, and a fixed metallic member mounted within said first end chamber, said metallic member being in sliding engagement with said tuning members for shortening the electrical lengths of said tuning members whereby the resonances of said tuning members are beyond the operating frequency range of said magnetron.

2. A magnetron including an anode having a plurality of integrated resonators in spaced relationship between first and second pole pieces, first and second end chambers between the circumferential surfaces of said anode and said first and second pole pieces respectively, adjustable instrumentalities mounted within said first pole piece and having tuning means attached thereto and in sliding engagement with said first pole piece and transferable therefrom into the resonators of said anode for altering the operating frequency of said resonators, and a metallic member mounted within said first end chamber for reducing the lumped inductance of said first end chamber, said tuning means having a sliding engagement with said metallic member for shortening the electrical length of said tuning means whereby the resonances of said tuning means are in the region other than the resonance region of said resonators.

3. A tunable magnetron having a multiresonator anode, a pole piece, an end chamber between one of the circumferential surfaces of said anode and the adjacent surface of said pole piece, a metallic member mounted within said end chamber, a plurality of adjustable tuning members, and a corresponding plurality of chambers in said pole piece and in said metallic member, said tuning members having a sliding fit within said chambers for lowering said tuning members through said chambers into the resonating cavities of said anode to vary the distributed inductance of said resonators.

4. A magnetron having a multiresonator anode, first and second pole pieces mounted in spaced relationship with respect to said anode, first and second end chambers between said pole pieces and said anode respectively, a metallic stepped ring mounted within said first end chamber, and a plurality of metallic pins adjustably mounted within said first pole piece and protruding therethrough and through said ring whereby said pins are insertable into the resonators of said anode to vary the operating frequency of said magnetron, said ring being dimensioned to shorten the electrical length of said pins to make the resonances of said pins beyond the resonances of said anode.

5. An ultra-high frequency tunable magnetron including a multiresonator anode, a pole piece mounted in spaced relationship with respect to said anode, an end chamber between said pole piece and said anode, a resonance suppressing, stepped, metallic ring mounted within said end chamber along the circumferential end thereof, a well within said first pole piece, a pin holder mounted within said well, and a plurality of metallic pins mechanically connected to said pin holder, said pins protruding through said polepiece and said ring, whereby said pins may be lowered into the resonators of said anode for altering the operating frequency thereof.

6. An ultra-high frequency tunable magnetron as defined in claim 5 in which the stepped portion of said ring includes a slanting surface partially hanging over the peripheral resonating cavities of said anode.

7. A magnetron having a multiresonator-multicavity anode, first and second pole pieces mounted in spaced relationship with respect to said anode, a metallic ring mounted between said anode and said first pole piece, and a plurality of metallic pins adjustably mounted within said first pole piece and protruding therethrough and through said ring for inserting said pins into the cavities of said anode.

POLYKARP KUSCH.

REFERENCES CITED

The following references are of record in the file of this patent:

UNITED STATES PATENTS

| Number | Name | Date |
|---|---|---|
| 2,406,276 | White | Aug. 20, 1946 |
| 2,408,234 | Spencer | Sept. 24, 1946 |
| 2,422,465 | Bondley | June 17, 1947 |

FOREIGN PATENTS

| Number | Country | Date |
|---|---|---|
| 509,102 | Great Britain | July 11, 1939 |